(12) United States Patent
Engelen et al.

(10) Patent No.: US 11,197,375 B2
(45) Date of Patent: Dec. 7, 2021

(54) LIGHTING ASSEMBLY WITH HIGH IRRADIANCE

(71) Applicant: Lumileds LLC, San Jose, CA (US)

(72) Inventors: Rob Engelen, Eindhoven (NL); Emanuel Stassar, Sprang Capelle (NL)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/993,851

(22) Filed: Aug. 14, 2020

(65) Prior Publication Data

US 2020/0375035 A1 Nov. 26, 2020

Related U.S. Application Data

(63) Continuation of application No. 16/614,681, filed as application No. PCT/EP2018/061807 on May 8, 2018, now Pat. No. 10,779,412.

(30) Foreign Application Priority Data

May 18, 2017 (EP) .................................... 17171721

(51) Int. Cl.
- *H05K 1/18* (2006.01)
- *H01L 27/15* (2006.01)
- *H01L 33/60* (2010.01)
- *H05K 1/02* (2006.01)

(52) U.S. Cl.
CPC ............ *H05K 1/181* (2013.01); *H01L 27/153* (2013.01); *H01L 33/60* (2013.01); *H05K 1/021* (2013.01); *H05K 2201/10106* (2013.01); *H05K 2201/10121* (2013.01)

(58) Field of Classification Search
CPC ......... H05K 1/181; H05K 2201/10106; H05K 2201/10121; H05K 1/021; H01L 27/153; H01L 33/60
USPC ........................................................ 174/260
See application file for complete search history.

(56) References Cited

U.S. PATENT DOCUMENTS

| | | |
|---|---|---|
| 5,745,176 A | 4/1998 | Lebens |
| 6,940,660 B2 | 9/2005 | Bluemel |
| 7,213,945 B2 | 5/2007 | Yoneda et al. |
| 7,506,998 B2 * | 3/2009 | Ansems ............... G02B 6/002 362/245 |

(Continued)

FOREIGN PATENT DOCUMENTS

| | | |
|---|---|---|
| GB | 2365962 | 2/2020 |
| WO | 2013/009221 A2 | 1/2013 |

*Primary Examiner* — Sherman Ng
(74) *Attorney, Agent, or Firm* — Volpe Koenig

(57) ABSTRACT

A lighting module and a lighting assembly provide high irradiance at long working distances. The lighting module includes at least two rows of multiple LEDs separated from each other by an intermediate area between the rows and one integral optical element on top of the at least two rows of multiple LEDs. The one integral optical element includes one collimator lens portion per row of LEDs extending along the row of LEDs. The collimator lens portions of different rows are merged together above the intermediate area. The collimator lens portions, seen in a direction perpendicular to the at least two rows, provide an off-axis focus for the one collimator lens portion, and focus light emitted from the at least two rows of multiple LEDs in a focus line extending parallel to the rows of LEDs at a focus distance above the optical element.

17 Claims, 5 Drawing Sheets

(56) References Cited

U.S. PATENT DOCUMENTS

| | | | |
|---|---|---|---|
| 8,508,126 B1* | 8/2013 | Morejon | F21V 9/38 |
| | | | 313/506 |
| 10,174,890 B2 | 1/2019 | Di Trapani et al. | |
| 2004/0042194 A1 | 3/2004 | Hsieh | |
| 2008/0043466 A1* | 2/2008 | Chakmakjian | F21V 17/002 |
| | | | 362/237 |
| 2008/0089052 A1 | 4/2008 | Katzir et al. | |
| 2009/0168395 A1 | 7/2009 | Mrakovich et al. | |
| 2010/0039830 A1 | 2/2010 | Cheung et al. | |
| 2011/0075418 A1 | 3/2011 | Mallory et al. | |
| 2011/0292655 A1* | 12/2011 | Ing | G09F 13/14 |
| | | | 362/241 |
| 2013/0021805 A1 | 1/2013 | Veerasamy et al. | |

* cited by examiner

LIGHTING ASSEMBLY WITH HIGH IRRADIANCE

CROSS REFERENCE TO RELATED APPLICATIONS

This application is a continuation of U.S. patent application Ser. No. 16/614,681, filed on Nov. 18, 2019, which is a § 371 application of International Application No. PCT/EP2018/061807, filed on May 8, 2018, which claims the benefit of EP Patent Application No. 17171721.8, filed on May 18, 2017, which are incorporated by reference as if fully set forth.

FIELD OF INVENTION

The invention relates to a lighting module providing a high irradiance at a long working distance, a lighting assembly comprising multiple lighting modules, methods to manufacture the lighting module as well as the lighting assembly and use of the lighting modules or lighting assemblies.

BACKGROUND

UV curing technology is utilized for curing inks, coatings, adhesives and other commercially useful UV sensitive materials through polymerization. While traditional mercury vapor lamps can be replaced in certain low UV intensity applications with LED based UV curing systems, it is more difficult to use LEDs as a replacement for high intensity applications. LED sources and LED systems have a relatively low output power compared to mercury-arc lamps. LED arrays are used at very close range to the material which poses the risks of the curing system coming into contact with the substrate that is being cured.

Consequently, there is a need for high irradiance LED UV systems with a long working distance.

SUMMARY

It is an object of the present invention to provide a high irradiance LED system with a long working distance.

The invention is defined by the independent claims. The dependent claims define advantageous embodiments.

According to a first aspect a lighting module is provided. The lighting module comprises at least two rows of multiple LEDs separated from each other by an intermediate area between the rows, where the rows are arranged on a front side of a printed circuit board, and one integral optical element on top of the multiple LEDs in order to shape light emitted from each of the multiple LEDs, where the optical element comprises one collimator lens portion per row of LEDs extending along the row of LEDs, where the collimator lens portions of different rows are merged together above the intermediate area in order to form the one single optical element, where the collimator lens portions seen in a direction perpendicular to the row of LEDs are shaped in order to provide an off-axis focus for each of the collimator lens portions, where the shapes are adapted to each other in order to focus the light emitted from the rows of LEDs in a focus line extending parallel to the rows of LEDs at a focus distance above the optical element. The individual collimator lens portions seen in a direction perpendicular to the row of LEDs are each shaped asymmetrically with respect to a first reference plane comprising the optical axis of the respective row of LEDs, wherein the first reference plane is parallel to the rows of LEDs. The individual collimator lens portions may be arranged symmetrically or asymmetrically to each other with respect to a second reference plane which is perpendicular to a plane comprising the rows of LEDs and which comprises the focus line. The asymmetric arrangement with respect to the second reference plane may be used to adapt the position of the focus line parallel to the plane comprising the rows.

The term "LED" denotes any solid state lighting light source. LEDs are typically small (less than 4 mm.sup.2) and available e.g. ranging from visible and ultraviolet wavelengths with very high brightness. LEDs have many advantages over incandescent light sources including lower energy consumption, longer lifetime, improved physical robustness, smaller size, and faster switching.

A row of multiple LEDs denote a linear arrangement of multiple LEDs adjacent to each other forming a line of LEDs, especially a straight line of LEDs. A printed circuit board (PCB) denotes the mechanical support, which electrically connects the components arranged on the printed circuit board (here the LEDs) using conductive tracks, pads and other features prepared onto a non-conductive substrate. Components might be soldered or adhesively bonded on the PCB. Advanced PCBs may contain components embedded in the substrate. For high-density LED arrays it is crucial to have effective heat transfer from the LED array to the heat sink (typically copper). For this, typically, copper-substrate PCBs or ceramic PCB are commonly used because of the high thermal conductivity.

The term "optical element" denotes any element acting upon light passing through said element. The optical element is an at least partially transparent body suitably shaped to act upon the light in the desired way causing refraction, diffraction, reflection or blocking parts of the light beam passing the optical element. A collimator as an optical element narrows the light beam in a specific direction, e.g. focusing the light beam on a focus point having a focus distance to the collimator or optical element comprising the collimator. The term "collimator lens portion" denotes an optical element comprising a collimator lens as a part (portion) of the optical element. The term "off-axis focus" denotes a focus point deviating from the optical axis of the element providing the focused beam, here the collimator lens portions.

This invention improves the peak irradiance by using the specified optic on a LED array. The lighting module according to the present invention provides a high irradiance LED system with a long working distance enabling, e.g. for curing purposes or other high power LED applications. In case of using the lighting module for curing purposes, e.g. as a light source within a curing apparatus, the LEDs can be arranged at a secure distance to the to-be-cured material avoiding the risk of the curing apparatus, especially the light source of the curing apparatus, coming into contact with the material that is being cured. Curing might be applied to organic materials, e.g. where monomers are converted into polymers in order to harden the material. This is especially advantageous in case of curing materials which passes the light source with high velocities, e.g. in continuous curing processes for flat sheets of material.

The lighting module may be arranged in such a way that the rows of LEDs are arranged parallel to each other. A parallel arrangement enables to achieve a closer packaging of the multiple LEDs and provides a defined focus at some height above the optic in the direction along the rows of LEDs.

The lighting module may be arranged in such a way that the LEDs are light emitters with a peak wavelength of less than 460 nm, preferably the LEDs are UV-light emitting LEDs. Curing is a process during which ultraviolet light and visible light is used to initiate a photochemical reaction that generates a crosslinked network of polymers. Some composite resins might be cured at peak wavelengths of 360 nm or 388 nm. UV Curing is adaptable to printing, coating, decorating, stereography and assembling of a variety of products and materials. This is made possible by some of its key attributes, it is: a low temperature process, a high speed process, and a solventless process since curing is by polymerization rather than by evaporation.

The lighting module may be arranged in such a way that the LEDs in each row of the LEDs are closely packed to each other. The gap between two adjacent LEDs can be less than half of the adjacent LED center-to-center distance in this case.

There are two important factors that determine the curing quality: total dose and peak irradiance. In order to achieve both increased dose and peak irradiance, LEDs must be closely packed together. Packaging that allows greater number of LEDs to be more densely fit into a defined area have an advantage over less dense solutions.

High-power LEDs can be separated in two categories: chip-scale packages and conventional domed packages. The former has a total outer dimension close to the internal emitting area of the LED. Such LEDs offer a very high packing density and therefor a high flux density while the individual LED efficiency is typically somewhat lower than the conventional domed packages. The dome of conventional domed packages, typically a silicone or glass, improves the extraction efficiency of light out of the LED, but is also forces the outer package dimensions to be significantly larger than the internal LED emitting area. For collimating purposes, an array of chip-scale packages is advantageous as though an optic, the higher flux density allows higher irradiance at some distance above the optic.

The lighting module may be arranged in such a way that the collimator lens portions are so-called total internal reflectance (TIR) collimator portions. These make use of total internal reflection (TIR) to direct light towards a light emitting surface. An optical element is denoted as a TIR element when collimating the light rays from the light emitter, both by reflecting them and by refracting them. Theoretically, all of the light produced by the emitter is gathered by the TIR element, here the TIR collimator portions. A TIR element takes advantage of "total internal reflection" where light that strikes a surface at a shallow angle will bounce off the surface and continue through the material instead of refracting. The TIR collimator portion collimates the light and sends a concentrated beam of light out in the same direction, giving a tight hotspot with greater throw. A typical TIR element looks like a cone with a hole where the point should be extending about halfway through the lens. This hole fits over the LED and any rays that strike the flat bottom (bottom is curved to focus the light instead of letting it pass straight through) of the hole will go straight out the front, giving a small hotspot.

The lighting module may be arranged in such a way that each of the TIR collimator portions comprise an inner refractive surface building a recess to enclose the row of LEDs on its light emitting side, an outer reflective surface facing away from the LEDs and a light emitting surface, wherein the inner refractive surface has a first and a second entrance surface to direct entering light emitted from the row of LEDs towards the light emitting surface of the TIR collimator portion, where the first entrance surface is suitably shaped to collimate the entering light directly towards the light emitting surface, whereby the second entrance surface is suitably shaped to direct the entering light towards the outer reflective surface, and where the outer reflective surface is suitably shaped to collimate the portion of the light entered into the TIR collimator portion via the second entrance surface towards the light emitting surface. This collimator shape provides a focused light beam with improved brightness. The lighting module may be arranged in such a way that the light emitting surfaces of each of the merged TIR collimator portions establish a single light emitting surface of the optical element.

The lighting module may be arranged in such a way that a cooling element is attached to the printed circuit board on a backside of the printed circuit board. Close packing of high power LEDs leads to thermal crowding which lowers the efficiency. With the cooling element the efficiency is increased.

According to a second aspect a lighting assembly comprising multiple lighting modules according to the present invention is provided, where the lighting modules are arranged next to each other in order to align the rows of LEDs of each lighting module to the rows of the neighbored lighting modules to establish continued rows of LEDS across the multiple lighting modules. The modular concept of the lighting assembly enables the adaption to the length of the lighting assembly to the demanded length for the particular application of the lighting assembly as a light source. Also the lighting assembly provides a high irradiance LED system with a long working distance with adaptable length of the focus line along the rows of LEDs at the focus distance.

The lighting assembly may be arranged in such a way that the optical elements of each lighting module are established by one optical assembly element extending along the continued rows of LEDs across the multiple lighting modules. On one hand the optical assembly element across all lighting modules provides an improved mechanical stability of the lightings assembly and on the other hand ensures the same focus properties for all LEDs arranged in the rows across the multiple lighting modules.

The lighting assembly may be arranged in such a way that an assembly cooling element is arranged on a backside of the lighting assembly established by all backsides of the lighting modules. Close (dense) packing of high power LEDs leads to thermal crowding which lowers the efficiency. With the assembly cooling element the efficiency is increased for all LEDs of all lighting modules ensuring the LEDs working with essentially the same efficiency along the row of LEDs.

According to a third aspect a method to manufacture a lighting module according to the present invention is provided. The method comprises the steps of Arranging multiple LEDs in at least two rows of LEDs separated from each other by an intermediate area between the rows on a front side of a printed circuit board, preferably the rows of LEDs are arranged parallel to each other; and Arranging one integral optical element on top of the multiple LEDs in order to shape light emitted from each of the multiple LEDs, where the optical element comprises one collimator lens portion per row of LEDs extending along the row of LEDs, where the collimator lens portions of different rows are merged together above the intermediate area in order to form the one single optical element, where the collimator lens portions seen in direction perpendicular to the row of LEDs are shaped in order to provide an off-axis focus for each of the collimator lens portions, where the shapes are adapted to each other in order to focus the light emitted from the rows of LEDs in a focus line extending parallel to the rows of LEDs at a focus distance above the optical element, Preferably further comprising the step of attaching a cooling element to the printed circuit board on a backside of the printed circuit board.

The method according to the present invention enables manufacturing of a lighting module providing a high irradiance LED system with a long working distance enabling.

According to a fourth aspect a method to manufacture a lighting assembly according to the present invention is provided. The method comprises the steps of arranging multiple lighting modules according to the present invention next to each other, and aligning the rows of LEDs of each lighting module to establish continued rows of LEDs across the multiple lighting modules, preferably further comprising the step of arranging an assembly cooling element on a backside of the lighting assembly established by all backsides of the lighting modules.

The method may be arranged in such a way that it further comprises the step of establishing the optical elements of each lighting module by one optical assembly element extending along the continued rows of LEDs across the multiple lighting modules.

According to a fifth aspect a use of a lighting module or a lighting assembly both according to the present invention as a light source for material curing purposes is provided. The established light source of a curing apparatus can be arranged at a secure distance to the to-be-cured material avoiding the risk of the curing apparatus, especially the light source of the curing apparatus, coming into contact with the material that is being cured.

It shall be understood that a preferred embodiment of the invention can also be any combination of the dependent claims with the respective independent claim.

Further advantageous embodiments are defined below.

BRIEF DESCRIPTION OF THE DRAWING(S)

These and other aspects of the invention will be apparent from and elucidated with reference to the embodiments described hereinafter.

The invention will now be described, by way of example, based on embodiments with reference to the accompanying drawings.

In the drawings.

In the Figures, like numbers refer to like objects throughout. Objects in the FIGS. are not necessarily drawn to scale.

DETAILED DESCRIPTION OF THE PREFERRED EMBODIMENT(S)

Various embodiments of the invention will now be described by means of the Figures.

Figure 1:
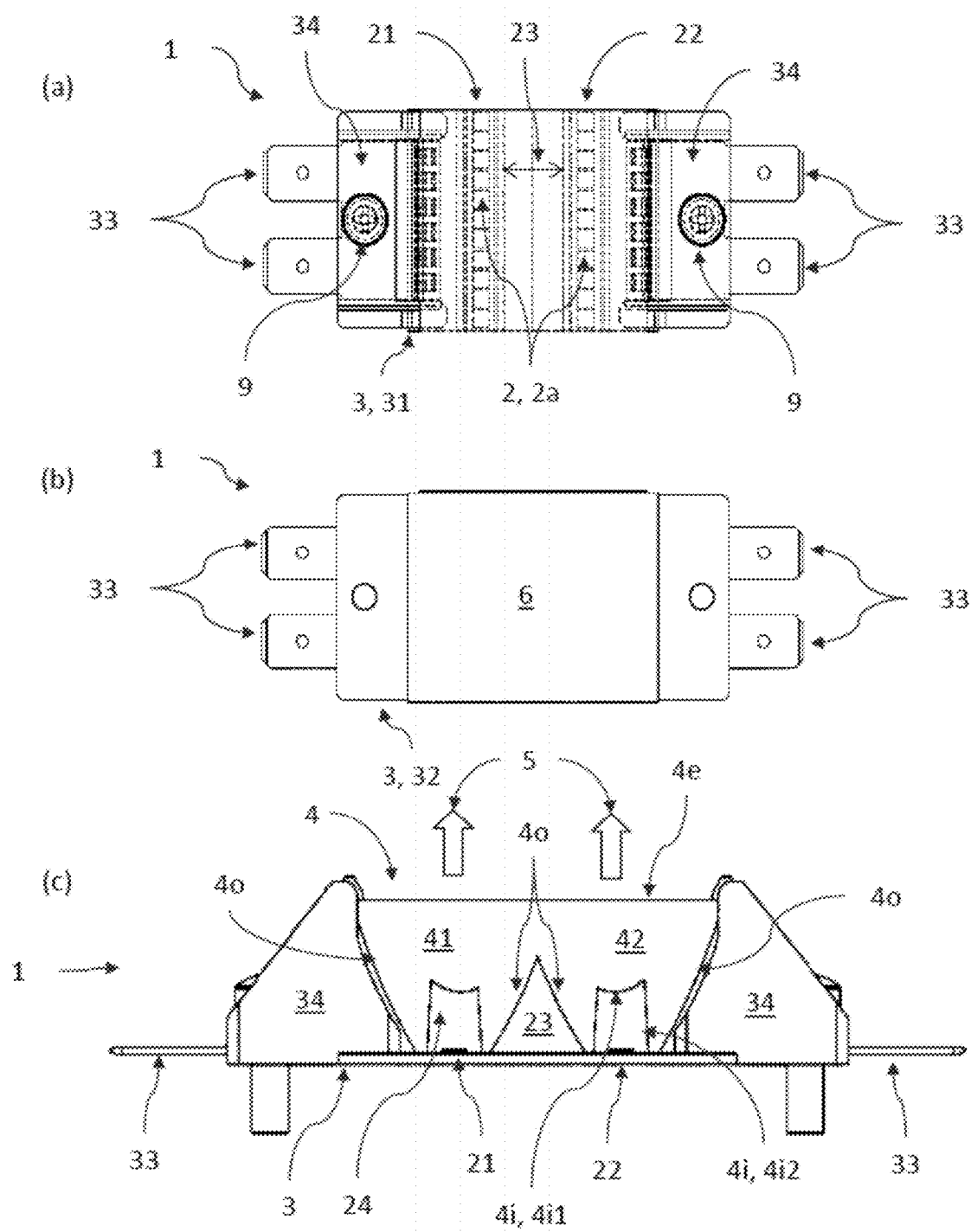
FIG. 1 shows a principle sketch of the lighting module according to the present invention (a) in a top view onto the front side, (b) in a top view onto the backside, and (c) in a side view.

FIG. 1 shows a principle sketch of the lighting module according to the present invention (a) in a top view onto the front side, (b) in a top view onto the backside, and (c) in a side view. The lighting module 1 comprises two rows 21, 22 of eleven LEDs 2 each which are closely packed. The rows are separated from each other by an intermediate area 23 between the rows 21, 22. The rows 21, 22 are arranged parallel to each other on a front side 31 of a printed circuit board 3 further comprising electrical contacts 33 to operate the rows of LEDs. The printed circuit board 3 might be fixed to another substrate, holder or housing (not shown here) by screws 9 or other fixing means. The lighting module 1 further comprises one integral optical element 4 on top of the LEDs 2 in order to shape light 5 emitted from each of the multiple LEDs 2, where the optical element 4 comprises one collimator lens portion 41, 42 per row 21, 22 of LEDs extending along the row 21, 22 of LEDs. The collimator lens portions 41, 42 of different rows 21, 22 are merged together above the intermediate area 23 in order to form the one single optical element 4, where the collimator lens portions 41, 42 seen in a direction perpendicular to the row 21, 22 of LEDs are shaped in order to provide an off-axis focus F (see FIG. 3) for each of the collimator lens portions 41, 42. The shapes are adapted to each other in order to focus the light 5 emitted from the rows 21, 22 of LEDs in a focus line FL (see FIG. 3) extending parallel to the rows 21, 22 of LEDs at a focus distance FD (see FIG. 3) above the optical element 4. The collimator lens portions 41, 42 are in this embodiment each shaped asymmetrically with respect to a first reference plane comprising the optical axis OA (see FIG. 3) of the respective individual collimator lens portion or row 21, 22 of LEDs, wherein the first reference plane is parallel to the rows 21, 22 of LEDs. The collimator lens portions 41, 42 are in this embodiment shaped mirror symmetric to each other with respect to a second reference plane which is perpendicular to a plane comprising the rows 21, 22 of LEDs and which comprises the focus line FL. The optical element 4 might be made of glass or transparent plastic material. The LEDs 2 might be light emitters with a peak wavelength of less than 460 nm. In an embodiment the LEDs 2 are UV-light emitting LEDs.

FIG. 1b shows the lighting module 1 from its backside, where a cooling element 6 is attached to the printed circuit board 3 on a backside 32 of the printed circuit board 3.

FIG. 1c shows the optical element 4 in more details in a side view, where the collimator lens portions 41, 42 of the optical element 4 are so-called TIR collimator portions, where each of the TIR collimator portions 41, 42 comprise an inner refractive surface 4i building a recess 24 to enclose the row 21, 22 of LEDs on its light emitting side 2a, an outer reflective surface 4o facing away from the LEDs 2 and a light emitting surface 4e, wherein the inner refractive surface 4i has a first and a second entrance surface 4i1, 4i2 to direct entering light 5 emitted from the row 21, 22 of LEDs towards the light emitting surface 4e of the TIR collimator portion 41, 42, where the first entrance surface 4i1 is shaped as a asymmetric lens to collimate the entering light 5 directly towards the light emitting surface 4e, where the second entrance surface 4i2 is shaped as a circular wall around the LEDs 2 to direct the entering light 5 towards the outer reflective surface 4o, and where the outer reflective surface 4o has a tulip-like shape to collimate the portion of the light 5 entered into the TIR collimator portion 41, 42 via the second entrance surface 4i2 towards the light emitting surface 4e. The reflection at reflective outer surface 4o is in this embodiment due to TIR. The reflective outer surface may alternatively have a metal coating in order to support reflection of the light 5 towards the light emitting surface 4e, where the thickness of the metal coating is adapted to be reflect all light towards the emitting surface 4e. Here the light emitting surfaces 4e of each of the merged TIR collimator portions 41, 42 establish a single flat light emitting surface 4e of the optical element 4. The optical element 4 is fixed in a holder 34 attached to the printed circuit board or being part of the printed circuit board, e.g. by clamping. The holder 34 is arranged outside the emitting surfaces 2a of the LEDs and the designed light path for the optical element 4 and the application of the lighting module 1.

Figure 2:
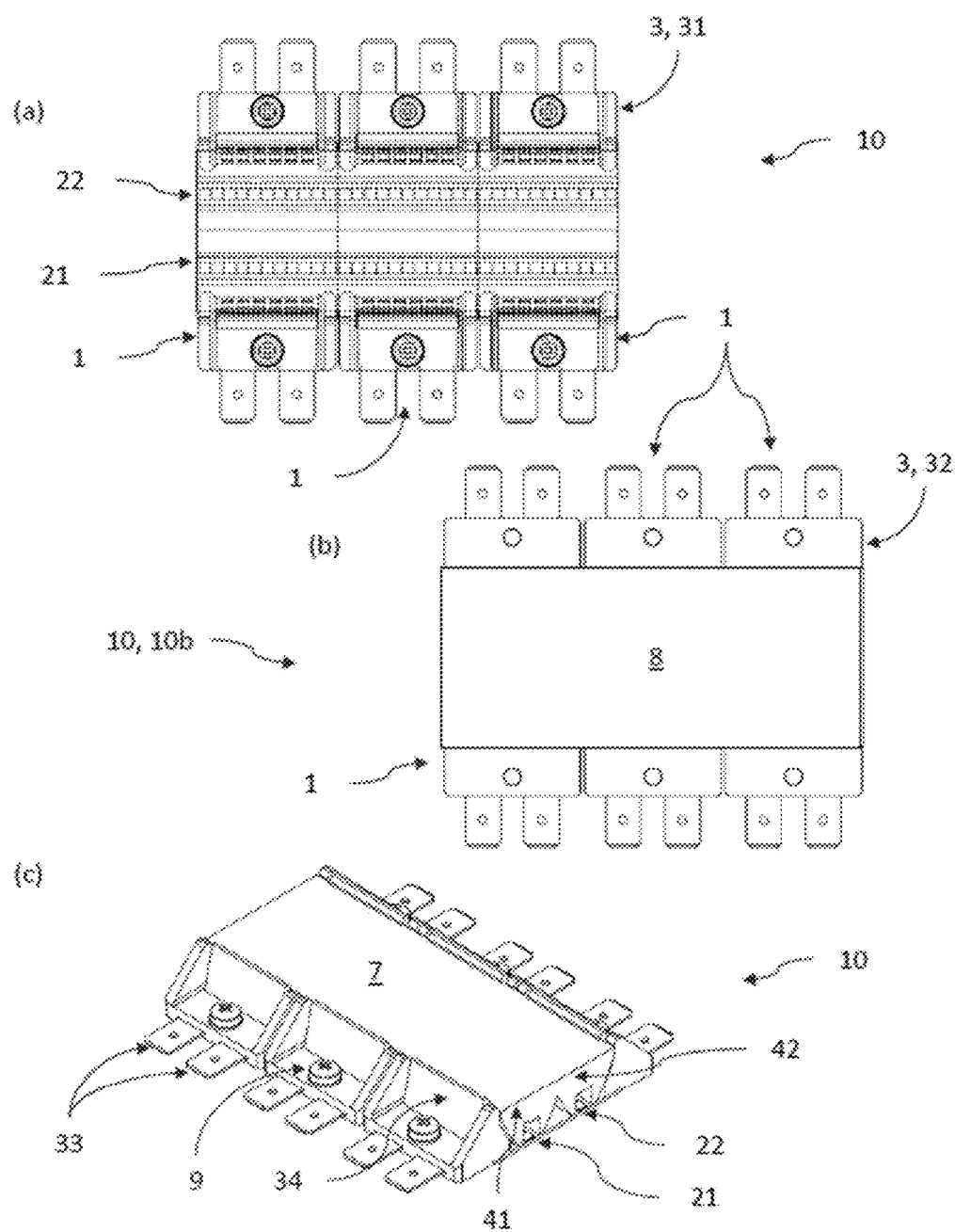
FIG. 2 shows a principle sketch of the lighting assembly according to the present invention (a) in a top view onto the front side, (b) in a top view onto the backside, and (c) in a perspective view.

FIG. 2 shows a principle sketch of the lighting assembly 10 according to the present invention (a) in a top view onto the front side, (b) in a top view onto the backside, and (c) in a perspective view. The lighting assembly 10 in this embodiment comprises three lighting modules 1 according to FIG. 1 where the lighting modules 1 are arranged next to (beside of) each other in order to align the rows 21, 22 of LEDs 2 of each lighting module 1 to the rows 21, 22 of the neighbored lighting modules 1 to establish continued rows 21, 22 of LEDs 2 across the multiple lighting modules 1. Compared to the single lighting module 1 of FIG. 1 the focus line is three times longer enabling the processing of larger material samples. FIG. 2b shows the backside 10b of the lighting assembly 10, where an assembly cooling element 8 is arranged on the backside 10b established by all backsides 32 of the lighting modules 1 of the lighting assembly 10. FIG. 2c shows the lighting assembly 10 in a perspective view where the optical elements 4 of each lighting module 1 are established by one single optical assembly element 7 extending along the continued rows 21, 22 of LEDs 2 across the multiple lighting modules 1, which is fix to the holders 34 of each lighting module 1, e.g. via clamping. The optical assembly element might be made of the same materials as the optical elements of each lighting module 1.

Figure 3:
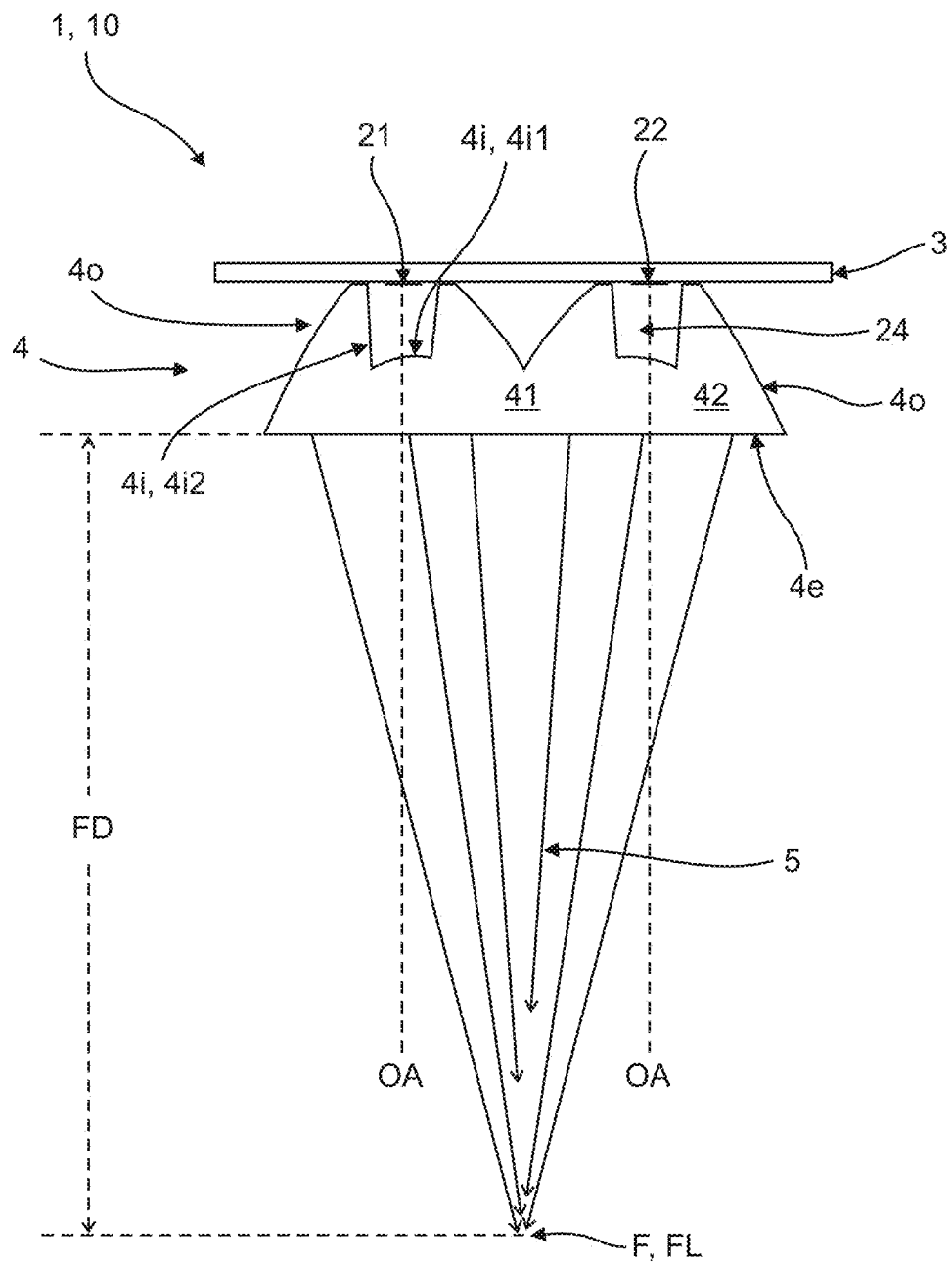
FIG. 3 shows a principle sketch of the optical element focusing the light emitted from the rows of LEDs of a lighting module or lighting assembly according to the present invention.

FIG. 3 shows a principle sketch of the optical element 4 focusing the light 5 emitted from the rows 21, 22 of LEDs 2 of a lighting module 1 or lighting assembly 10 according to the present invention. The collimator lens portions 41, 42 are each shaped asymmetrically in order to provide an off-axis focus F for each of the collimator lens portions 41, 42, where the asymmetrical shapes are adapted to each other in order to focus the light 5 emitted from the rows 21, 22 of LEDs in a focus line FL extending parallel to the rows 21, 22 of LEDs at a focus distance FD above the optical element 4. The optical axes OA of each row of LEDs in case of no present optical element are indicated as dashed lines. The optical element 4 shown here has a length parallel to the rows 21, 22 of LEDs of 50 mm, a width perpendicular to the rows 21, 22 of LEDs of 30 mm and a height above the printed circuit board 3 of 10 mm. At a distance of 50 mm above the emitting surface 4e of the optical element 4 the beam of light 5 has a full width at half of the maximum intensity of 22 mm. For purpose of optical analysis, the lengths of the rows are assumed to be infinitely long. The individual collimator lens portions 41, 42 are in this embodiment only slightly asymmetrically to each other with respect to a second reference plane (not shown) which is perpendicular to the plane comprising the rows 21, 22 of LEDs and which comprises the focus line FL. The asymmetry of the individual collimator lens portions 41, 42 to each other may be used to shift the focus line FL (which is in this embodiment perpendicular to the plane of FIG. 3) parallel to the plane comprising the rows 21, 22 of LEDs which may be represented by the surface of the printed surface board 3 to which the LEDs are attached to.

Figure 4:
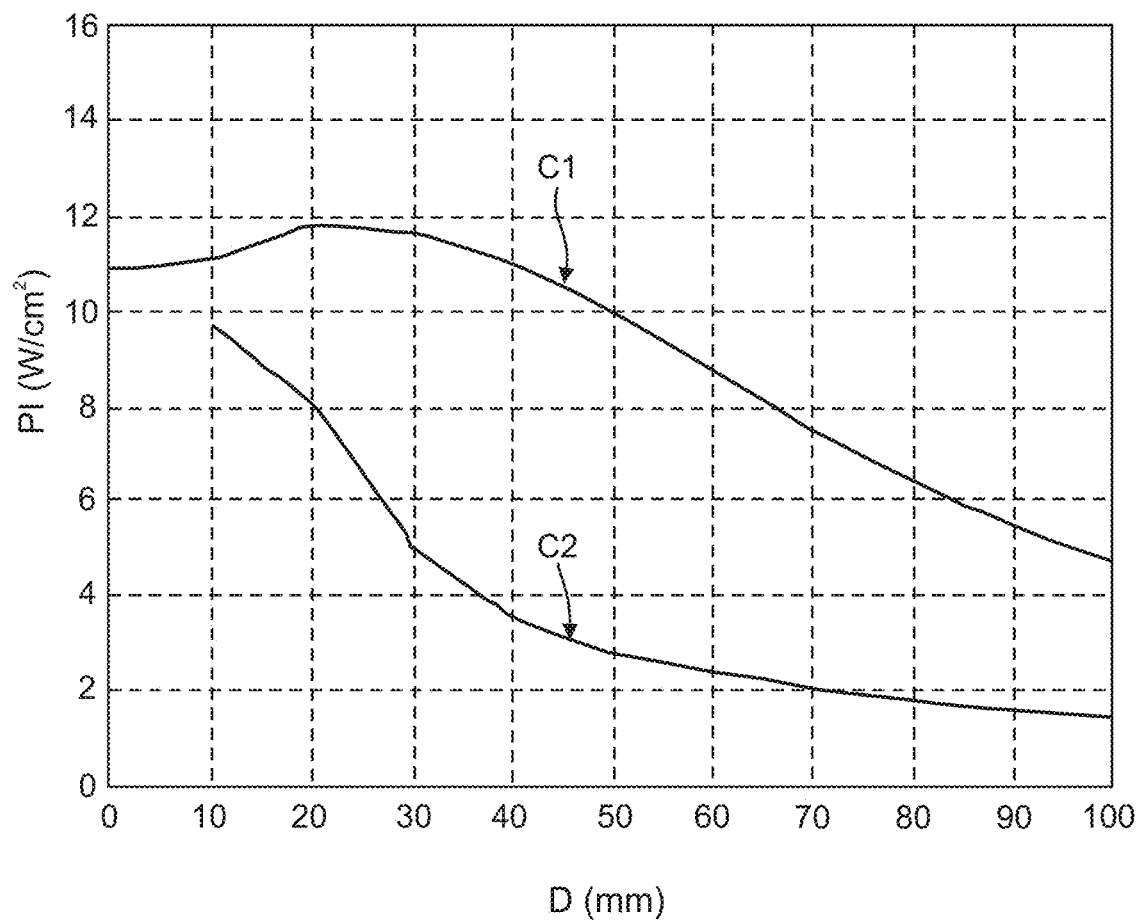
FIG. 4 shows the peak irradiance as a function of the distance from the optical element of lighting modules with and without an optical element as shown in FIG. 1-3.

FIG. 4 shows the peak irradiance PI as a function of the distance D from the optical elements 4 of lighting modules 1 with and without optical elements 4 as shown in FIG. 1-3. The peak irradiance was obtained from a row of neighboring lighting modules operated of 176 W optical output power each and comprising two rows 21, 22 of LEDs being closed packed with 22 LEDs per row of 4 mm$^2$ FlipChip UV-LEDs offering high irradiance. The curve C2 was obtained from these lighting modules 1 without optical elements 4 arranged above the rows 21, 22 of LEDs. C2 shows relatively high peak irradiances larger than 8 W/cm$^2$ at small distances below 20 mm steeply decreasing below 2 W/cm$^2$ for distances above 70 mm. The curve C1 relates to a row of neighboring lighting modules 1 according to the present invention with optical elements 4. Here the peak irradiance PI is above 10 W/cm$^2$ up to a distance D of 50 mm and is above 8 W/cm$^2$ up to a distance of 65 mm. At a distance D of 100 mm the peak irradiance PI for lighting modules 1 with optical elements 4 is more than a factor two higher the peak irradiance for lighting modules without an optical element. This shows that the lighting modules according to the present invention is able to provide a high irradiance LED system with a long working distance of 10 W/cm$^2$ at a distance of 50 mm, which is a practical distance for using the lighting module for curing purposes avoiding the risk of the lighting module 1 coming into contact with the to-be-cured material.

Figure 5:
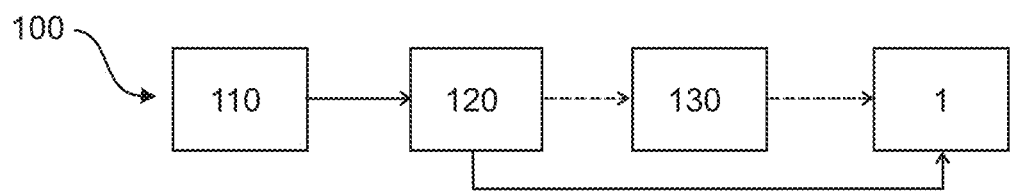
FIG. 5 shows a principle sketch of the method to manufacture the lighting module according to the present invention.

FIG. 5 shows a principle sketch of the method 100 to manufacture the lighting module 1 according to the present invention. The method 100 comprises the steps of arranging 110 multiple LEDs in at least two rows 21, 22 of LEDs separated from each other by an intermediate area 23 between the rows 21, 22 on a front side 31 of a printed circuit board 3, where the rows 21, 22 of LEDs are preferably arranged parallel to each other; and arranging 120 one integral optical element 4 on top of the multiple LEDs 2 in order to shape light 5 emitted from each of the multiple LEDs 2, where the optical element 4 comprises one collimator lens portion 41, 42 per row 21, 22 of LEDs extending along the row 21, 22 of LEDs, where the collimator lens portions 41, 42 of different rows 21, 22 are merged together above the intermediate area 23 in order to form the one single optical element 4, where the collimator lens portions 41, 42 seen in direction perpendicular to the row 21, 22 of LEDs are each shaped asymmetrically in order to provide an off-axis focus F for each of the collimator lens portions 41, 42, where the asymmetrical shapes are adapted to each other in order to focus the light 5 emitted from the rows 21, 22 of LEDs in a focus line FL extending parallel to the rows 21, 22 of LEDs at a focus distance FD above the optical element 4. In an embodiment the method 100 further comprises the step of attaching 130 a cooling element 6 to the printed circuit board 3 on a backside 32 of the printed circuit board 3.

Figure 6:
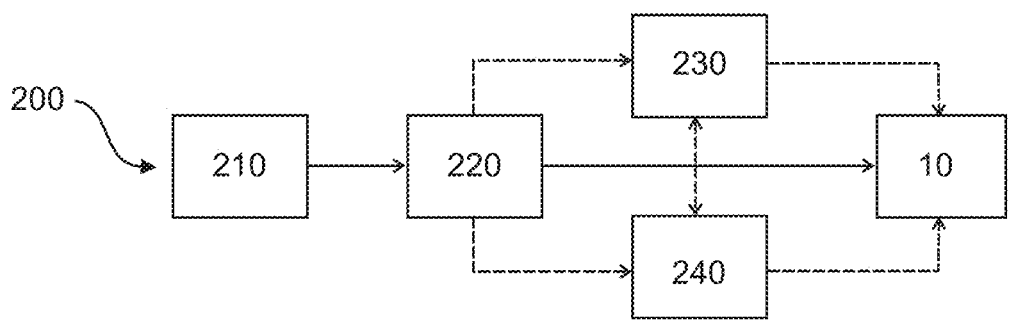
FIG. 6 shows a principle sketch of the method to manufacture the lighting assembly according to the present invention.

FIG. 6 shows a principle sketch of the method 200 to manufacture the lighting assembly 10 according to the present invention. The method 200 comprises the steps of arranging 210 multiple lighting modules 1 next to each other and aligning 220 the rows 21, 22 of LEDs of each lighting module 1 to establish continued rows 21, 22 of LEDs across the multiple lighting modules 1. In an embodiment the method 200 further comprises the step of arranging 230 an assembly cooling element 8 on a backside 10b of the lighting assembly 10 established by all backsides 32 of the lighting modules 1. In an alternative embodiment, where the lighting modules 1 being arranged next to each other and the rows of LEDs are aligned and the lighting modules do not comprise optical elements the method 200 may comprise the step of establishing 240 the optical elements 4 for each lighting module 1 by placing one single optical assembly element 7 extending along the continued rows 21, 22 of LEDs 2 into the holder 34 of the multiple lighting modules 1.

Figure 7:
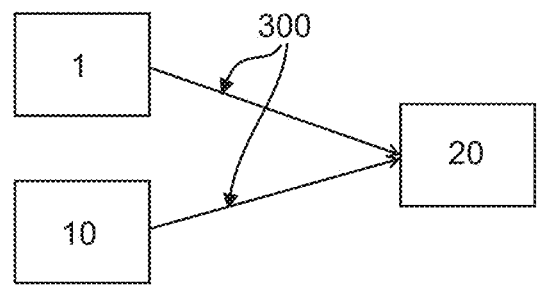
FIG. 7 shows a principle sketch of the use of the lighting module or the lighting assembly for curing purposes.

FIG. 7 shows a principle sketch of the use 300 of the lighting module 1 or the lighting assembly 8 as a light source 20 for material curing purposes in a curing apparatus, where the LEDs 2 can be arranged at a secure distance to the to-be-cured material avoiding the risk of the curing apparatus, especially the light source 20 of the curing apparatus, coming into contact with the material that is being cured. Curing might be applied to organic materials, e.g. where monomers are converted into polymers in order to harden the material. This is especially advantageous in case of curing material which passes the light source with high velocities, e.g. in a continuous curing processes for flat sheets of material.

While the invention has been illustrated and described in detail in the drawings and the foregoing description, such illustration and description are to be considered illustrative or exemplary and not restrictive.

From reading the present disclosure, other modifications will be apparent to persons skilled in the art. Such modifications may involve other features which are already known in the art and which may be used instead of or in addition to features already described herein.

Variations to the disclosed embodiments can be understood and effected by those skilled in the art, from a study of the drawings, the disclosure and the appended claims. In the claims, the word "comprising" does not exclude other elements or steps, and the indefinite article "a" or "an" does not exclude a plurality of elements or steps. The mere fact that certain measures are recited in mutually different dependent claims does not indicate that a combination of these measures cannot be used to advantage.

Any reference signs in the claims should not be construed as limiting the scope thereof.

LIST OF REFERENCE NUMERALS 1 lighting module according to the present invention
2 LED(s)
2a light emitting surface of the LED(s)
21 a (first) row of LEDs
22 a (second) row of LEDs
23 intermediate area between the rows of LEDs
24 recess above the LEDs established by the collimator lens portions
3 printed circuit board (PCB)
31 frontside of the PCB
32 backside of the PCB
33 electrical contacts of the PCB
34 holder to fix the optical element to the PCB
4 optical element
4i inner refractive surface of the collimator lens portions
4i1 first entrance surface of the inner refractive surface
4i2 second entrance surface of the inner refractive surface
4o outer reflective surface of the collimator lens portions/ optical element
4e light emitting surface of the collimator lens portions
41 collimator lens portion assigned to one row of LEDs
42 collimator lens portion assigned to another row of LEDs
5 light emitted from the LED(s)
6 cooling element
7 optical assembly element
8 assembly cooling element
9 fixing means (e.g. a screw)
10 lighting assembly according to the present invention
10b backside of the lighting assembly
20 light source for a material curing process
100 method to manufacture the lighting module according to the present invention
110 Arranging multiple LEDs in at least two separate rows of LEDs
120 Arranging one integral optical element on top of the multiple LEDs
130 attaching a cooling element to the printed circuit board
200 method to manufacture the lighting assembly according to the present invention
210 arranging multiple lighting modules next to each other
220 aligning the rows of LEDs of each lighting module to establish continued rows of LEDs across the multiple lighting modules
230 arranging an assembly cooling element on a backside of the lighting assembly
240 establishing the optical elements of each lighting module by one optical assembly element
300 Use of a lighting module/assembly as a light source for material curing
C1 peak irradiance as a function of D for a lighting module with optical element
C2 peak irradiance as a function of D for a lighting module without optical element
D distance from optical element
F off-axis focus of the collimator lens portions of the rows of LEDs
FD focus distance between optical element of of-axis focuses
FL focus line provided by the optical element
OA optical axis
PI Peak irradiance of the light emitted from the LEDs

What is claimed is:

1. A lighting system comprising:
a printed circuit board;
a first row of ultra-violet (UV) light-emitting diodes (LEDs) on a surface of the printed circuit board;
a second row of UV LEDs on the surface of the printed circuit board and spaced apart from the first row of UV LEDs, wherein the UV LEDs are spaced apart within each of the first and second rows with adjacent UV LEDs having a gap between them having a distance less than half of a center-to-center distance between the adjacent UV LEDs; and
an optical element comprising at least a first collimator lens portion, a second collimator lens portion, and a third portion above both the first and second collimator lens portions, the optical element disposed over the printed circuit board with the first collimator lens portion over the first row of UV LEDs and the second collimator lens portion over the second row of UV LEDs, each of the first and second collimator lens portions comprising:
a recess in the optical element that encloses the first or second row of UV LEDs, the recess forming an inner refractive surface that comprises a first entrance surface configured to direct light from the first or second row of UV LEDs toward the third portion and a second entrance surface configured to direct light from the first or second row of UV LEDs in a lateral direction within the optical element, and
an outer reflective surface facing away from the UV LEDs configured to collimate the light that enters the integral optical element via the second entrance surface in the lateral direction toward the third portion, wherein the lighting system has a peak irradiance (PI) above 10 W/cm$^2$ up to a distance of 50 mm.

2. The lighting system of claim 1, wherein the first row of UV LEDs is parallel to the second row of UV LEDs.

3. The lighting system of claim 1, wherein the UV LEDs have peak wavelengths of less than 460 nm.

4. The lighting system of claim 1, further comprising a cooling element thermally coupled to a surface of the printed circuit board opposite the surface on which the LEDs are disposed.

5. The lighting system of claim 1, wherein the first entrance surface is asymmetric with respect to an optical axis of the respective first or second collimator lens portion.

6. The lighting system of claim 1, wherein the outer reflective surface surrounds the respective recess in the optical element.

7. The lighting system of claim 1, wherein the optical element is an integral optical element and the third portion connects the first and second collimator lens portions.

8. A lighting system comprising:
a plurality of lighting modules, each of the plurality of lighting modules comprising:
a first row of ultra-violet (UV) light-emitting diodes (LEDs) on a surface of the printed circuit board,
a second row of UV LEDs on the surface of the printed circuit board and spaced apart from the first row of UV LEDs, wherein the UV LEDs are spaced apart within each of the first and second rows with adjacent UV LEDs having a gap between them having a distance less than half of a center-to-center distance between the adjacent UV LEDs; and
an optical element comprising at least a first collimator lens portion, a second collimator lens portion, and a third portion above both the first and second collimator lens portions, the optical element disposed over the printed circuit board with the first collimator lens portion over the first row of UV LEDs and the second collimator lens portion over the second row of UV LEDs, each of the first and second collimator lens portions comprising:
a recess in the optical element that encloses the first or second row of UV LEDs, the recess forming an inner refractive surface that comprises a first entrance surface configured to direct light from the first or second row or UV LEDs toward the third portion and a second entrance surface configured to direct light from the first or second row of UV LEDs in a lateral direction within the optical element, and
an outer reflective surface facing away from the UV LEDs configured to collimate the light that enters the integral optical element via the second entrance surface in the lateral direction toward the third portion, each of the plurality of lighting modules arranged next to each other with the first row of UV LEDs aligned for each of the plurality of modules and the second row of UV LEDs aligned for each of the plurality of modules to form a continuous first row of UV LEDs and a continuous second rows of UV LEDs across each of the plurality of lighting modules, wherein the lighting system has a peak irradiance (PI) above 10 W/cm$^2$ up to a distance of 50 mm.

9. The system of claim 8, wherein the optical element comprises a single integral optical element over all of the plurality of lighting modules.

10. The system of claim 8, further comprising a single cooling element thermally coupled to all of the plurality of lighting modules at surfaces of the printed circuit board opposite the surface on which the UV LEDs are disposed.

11. The system of claim 8, wherein the contiguous first row of UV LEDs is parallel to the contiguous second row of UV LEDs.

12. The system of claim 8, wherein the UV LEDs have peak wavelengths of less than 460 nm.

13. A method of manufacturing a lighting system, the method comprising: arranging a plurality of ultra-violet (UV) LEDs in a first row and a second row on a surface of at least one printed circuit board to form at least one lighting module, the second row of UV LEDs spaced apart from the first row of UV LEDs, wherein the UV LEDs are spaced apart within each of the first and second rows with adjacent UV LEDs having a gap between them having a distance less than half of a center-to-center distance between the adjacent UV LEDs; and
obtaining an optical element comprising at least a first collimator lens portion, a second collimator lens portion, and a third portion above both the first and second collimator lens portions, each of the first and second collimator lens portions comprising:
a recess in the optical element that encloses the first or second row of UV LEDs, the recess forming an inner refractive surface that comprises a first entrance surface configured to direct light from the first or second row or UV LEDs toward the third portion and a second entrance surface configured to direct light from the first or second row of UV LEDs in a lateral direction within the optical element, and
an outer reflective surface facing away from the UV LEDs configured to collimate the light that enters the integral optical element via the second entrance surface in the lateral direction toward the third portion; and arranging the optical element over the UV LEDs with the first collimator lens portion over the first row of UV LEDs and the second collimator lens portion over the second row of UV LEDs, wherein the lighting system has a peak irradiance (PI) above 10 W/cm$^2$ up to a distance of 50 mm.

14. The method of claim 13, wherein the at least one lighting module comprises a plurality of lighting modules, and the method further comprises:
arranging the plurality of light modules next to each other; and
aligning the first row of UV LEDs in each module and aligning the second row of UV LEDs in each module to form a continuous first row of UV LEDs and a continuous second rows of UV LEDs across each of the plurality of lighting modules.

15. The method of claim 14, wherein the arranging the optical element over the UV LEDs comprises arranging one optical element over all of the plurality of lighting modules.

16. The method of claim 14, further comprising attaching a single cooling element to surfaces of the printed circuit board of each of the plurality of modules opposite the surface on which the UV LEDs are disposed.

17. The method of claim 13, further comprising attaching a cooling element to a surface of the circuit board opposite the surface on which the UV LEDs are disposed.

* * * * *